United States Patent [19]

Magdo

[11] 4,044,454
[45] Aug. 30, 1977

[54] METHOD FOR FORMING INTEGRATED CIRCUIT REGIONS DEFINED BY RECESSED DIELECTRIC ISOLATION

[75] Inventor: Ingrid E. Magdo, Hopewell Junction, N.Y.

[73] Assignee: IBM Corporation, Armonk, N.Y.

[21] Appl. No.: 568,636

[22] Filed: Apr. 16, 1975

[51] Int. Cl.² .............................................. B01J 17/00
[52] U.S. Cl. ........................................ 29/578; 29/580; 29/590; 148/1.5; 148/186; 156/649; 156/657
[58] Field of Search .................. 148/1.5, 186, 187; 156/3, 7, 17, 11; 29/591, 578, 580, 590; 427/87, 94; 357/49, 50, 59

[56] References Cited

U.S. PATENT DOCUMENTS

| 3,755,001 | 8/1973 | Kooi et al. ............................. 148/1.5 |
| 3,783,047 | 1/1974 | Paffen et al. ........................... 148/1.5 |
| 3,808,058 | 4/1974 | Henning .................................. 156/17 |
| 3,853,633 | 12/1974 | Armstrong ............................... 148/1.5 |
| 3,899,363 | 8/1975 | Dennand ................................. 148/1.5 |
| 3,900,350 | 8/1975 | Appels et al. ........................... 29/578 |
| 3,904,450 | 9/1975 | Evans et al. ............................ 29/578 |
| 3,933,540 | 1/1976 | Kondo et al. ........................... 148/187 |
| 3,961,999 | 6/1976 | Atitipou et al. ........................ 29/578 |
| 3,962,779 | 6/1976 | Edwards et al. ........................ 29/578 |

Primary Examiner—Charles E. Van Horn
Assistant Examiner—Jerome W. Massie
Attorney, Agent, or Firm—J. B. Kraft

[57] ABSTRACT

In the fabrication of integrated circuits, a method is provided for forming dielectrically isolated regions in a silicon substrate comprising initially introducing conductivity-determining impurities into the substrate to form at least one region of one-type conductivity at the surface of said substrate. Then, a mask comprising a composite of a bottom layer of silicon dioxide and a top layer of silicon nitride is formed over at least a portion of the surface of said introduced regions. The substrate is then subsequently thermally oxidized to an extent sufficient to form regions of recessed silicon dioxide abutting and thus laterally defining said region of one-type conductivity. In this manner, it is ensured that the recessed silicon dioxide will abut introduced region irrespective of the extent of the "bird's beak" normally associated with thermal oxidation utilizing silicon dioxide-silicon nitride masking.

6 Claims, 18 Drawing Figures

METHOD FOR FORMING INTEGRATED CIRCUIT REGIONS DEFINED BY RECESSED DIELECTRIC ISOLATION

BACKGROUND OF THE INVENTION

In recent years, silicon nitride masks have become a sought-after expedient in the fabrication of integrated circuits. Originally, the art applied masking layers comprising silicon nitride directly onto silicon substrates. This gave rise to problems associated with high stresses created on the underlying silicon substrate by the silicon nitride-silicon interface. Such stresses were found in many cases to produce dislocations in the silicon substrate which appear to result in undesirable leakage current pipes and otherwise adversely affect the electrical characteristics of the interface. In order to minimize such interface stresses with silicon nitride layers, it has become the practice in the art to form a thin layer of silicon dioxide between the silicon substrate and the silicon nitride layer. While this approach has been relatively effective in the cases where this silicon dioxide-silicon nitride composite is utilized only for passivation, problems have arisen where these silicon dioxide-silicon nitride composites have been utilized as masks, and, particularly, when utilized as masks against thermal oxidation. During such thermal oxidation, there is a substantial additional lateral penetration of silicon oxide from the thermal oxidation beneath the silicon nitride. This lateral penetration is greatest at the mask-substrate interface to provide a laterally sloping structure known and recognized in the prior art as the undesirable "bird's beak".

The publications, "Local Oxidation of Silicon; New Technological Aspects," by J. A. Appels et al, Phillips Research Report 26, pp. 157 – 165, June 1971, and "Selective Oxidation of Silicon and Its Device Application," E. Kooi et al, *Semiconductor Silicon* 1973, published by the Electrochemical Society, Edited by H. R. Huff and R. R. Burgess, pp. 860 – 879, are representative of the recognition in the prior art of the "bird's beak" problems associated with silicon dioxide-silicon nitride composite masks.

The "bird's beak" problems are particularly significant when silicon dioxide-silicon nitride composite masks are used in the formation of recessed silicon dioxide to be used for dielectric isolation. In such recessed oxide formation techniques, the silicon dioxide-silicon nitride composite masks are first used as an etch barrier while recesses are etched through the mask openings in the silicon substrate. These recesses are subsequently subjected to the previously described thermal oxidation to form recessed silicon dioxide regions providing dielectric isolation extending into the silicon substrate from the surface. Such recessed silicon dioxide regions would be most desirably coplanar with the remainder of the silicon surface. However, because of the "bird's head", an undesirable bump in the order of from 4,000 to 5,000 A in height is present at the surface, but even more significantly, as a result of the "bird's beak", a lateral junction or edge of the recessed silicon dioxide isolation region is very vaguely defined. With any recessed oxide isolation it is highly desirable that the lateral edges of the recessed silicon dioxide be substantially vertical, i.e., perpendicular to the semiconductor substrate surface. Instead, as a result of the "bird's beak", the edges of the recessed silicon dioxide are gradually sloped with respect to the silicon surface, being at an angle which varies from 15° to 30° with respect to the surface instead of the desirable 90° angle.

Because of this gradual lateral junction in the recessed silicon dioxide, the recessed area does not clearly define abutting regions introduced by either diffusion or ion implantation, particularly shallow abutting regions. In the case of such shallow abutting regions, there is a distinct possibility that during subsequent etching steps part of the "bird's beak" at the surface will be etched away to provide an undesirable exposure of the P-N or other junction of the abutting shallow region.

However, even with deeper regions formed by diffusion, the indefiniteness of the lateral junction of the abutting recessed silicon dioxide region renders it difficult to control lateral geometries of introduced region, and therefore imposes the need for wider tolerances of lateral dimension in the integrated circuit layout.

The above mentioned lack of definition because of the "bird's beak" is particularly pronounced when the recessed silicon dioxide regions abutting the silicon region are utilized to define a region of a given conductivity type introduced into a silicon substrate region adjoining such recessed silicon dioxide regions. In such a case, one of the significant advantages of recessed oxide technology as taught in the prior art is the ability to eliminate precise mask alignment steps when introducing said conductivity-type region. In accordance with the art, it is desirable to first cover the surface of the substrate with a layer of an insulative material, particularly silicon dioxide, after which a step involving only very gross masking coupled with dip etching is utilized to avoid such mask alignment when forming openings in the silicon dioxide layer through which the conductivity-determining impurities are to be introduced into the silicon substrate. The dip etching process is continued for a time calculated to be sufficient to remove only the deposited silicon dioxide layer from the surface of selected silicon substrate region (the selection of regions is of course determined by the gross block-out mask) but insufficient to affect the surrounding recessed silicon dioxide region. However, because of the "bird's beak", the extent of such surrounding recessed oxide regions, particularly at the substrate surface, becomes indefinite and the portion of the silicon substrate exposed may vary substantially dependent on the extent of the "bird's beak". Thus, because of the variation in opening size, the introduced region may vary substantially in lateral dimension.

Because of this variation of lateral dimensions, contact openings made to such introduced regions through subsequently formed insulative layers cannot be made with any definiteness or precision because such contact opening may expose a surface junction between the introduced region and an abutting region of semiconductor material. Accordingly, an additional advantage of recessed silicon dioxide technology, i.e., that of defining contact openings to abutting regions formed in the substrate is also unrealized.

SUMMARY OF THE PRESENT INVENTION

Accordingly, it is an object of the present invention to provide a method of integrated circuit fabrication which utilizes recessed silicon dioxide regions to define regions of selected conductivity type introduced into the substrate wherein the definition of the introduced region is substantially unaffected by "bird's beak" problems.

It is another object of the present invention to provide a method of integrated circuit fabrication utilizing recessed silicon dioxide regions to at least partially define the electrical contact openings and contacts made to abutting regions of selected conductivity type introduced into the substrate wherein the nature of such electrical contacts is substantially unaffected by "bird's beak" problems.

It is a further object of the present invention to provide a method for integrated circuit fabrication utilizing recessed silicon dioxide dielectric isolation which is substantially free of problems of exposed junctions between regions of different conductivity at the surface of the silicon substrate during the formation of electrical contact openings to the substrate.

In accordance with the method of the present invention, the conductivity-determining impurities are first introduced into the substrate to form at least one region of a selected conductivity type at the surface of said substrate. Then, a mask comprising silicon nitride is formed over at least a portion of the surface of said region, after which, in accordance with one aspect of the present invention, recesses are etched in the unmasked portions of the substrate adjacent to said introduced region. Then, the recessed portions are thermally oxidized to an extent sufficient to form regions of recessed silicon oxide abutting and laterally defining said introduced regions of the selected conductivity type.

The above method is particularly effective when the mask comprises the standard composite of a silicon dioxide bottom layer and a silicon nitride top layer which has been recognized in the art as subject to the "bird's beak" problems. In the method of the present invention, the recessed silicon dioxide regions which are formed in the thermal oxidation step will abut and define the lateral sides of the selected conductivity type region previously introduced into the substrate. Thus, irrespective of the extent of the "bird's beak" there will be no problems in introducing the impurities since the impurities are introduced prior to the formation of the recessed oxide. Likewise, there will be no problem in forming contact openings since the introduced region will not have a lateral junction coincident with the contact opening which does not abut the recessed silicon dioxide. Thus, there will be no exposed silicon junction within the contact opening.

In accordance with a more specific embodiment of this aspect of the present invention, the initial introduction of impurity may blanket the silicon substrate surface or a substantial portion thereof. Then, the substrate is masked with the silicon nitride-silicon dioxide composite as described in order to mask a plurality of sub-regions in the blanket region, after which the silicon dioxide recessed regions are formed so as to laterally separate the blanket region into a plurality of regions of the selected conductivity type. In practicing this aspect of the invention, it is preferable that the etched recesses extend into the substrate beyond the depth of the blanket region.

In accordance with an alternative aspect of the present invention, instead of a blanket initial introduction of impurities, the conductivity-determining impurities are introduced into the silicon substrate to form a plurality of spaced regions of a selected conductivity type at the surface of the substrate. Then, the silicon nitride containing mask is formed over the surfaces of the spaced region while the substrate adjacent to the spaced regions remains exposed. Subsequently, the exposed portions of the substrate are subjected to thermal oxidation to an extent sufficient to form regions of recessed silicon dioxide abutting and laterally defining the regions of the selected conductivity type.

The foregoing and other objects, features and advantages of the invention will be apparent from the following more particular description of the preferred embodiment of the invention, as illustrated in the accompanying drawings.

EMBODIMENTS OF PRIOR ART

Before describing the preferred embodiments of the present invention, there will first be discussed problems of the prior art causing the "bird's beak" structure in the recessed silicon dioxide regions, particularly the problems presented during the formation of regions of selected conductivity type introduced into the substrate adjacent to the "bird's beak" as well as problems associated with the formation of contact openings through insulative layers through the silicon substrate adjacent to the "bird's beak".

Figure 1:
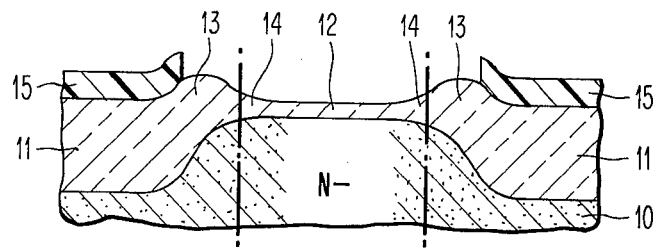
FIGS. 1 – 3' are diagrammatic sectional views of a portion of an integrated circuit in order to illustrate "bird's beak" problems associated with the prior art techniques of impurity introduction and the formation of contact.
Figure 1:
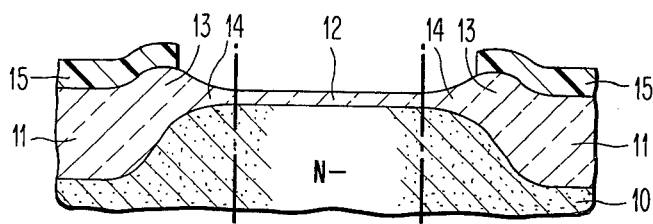

In the structure shown in FIGS. 1 and 1', there is shown a portion of a silicon substrate 10 defined by adjacent recessed silicon dioxide regions 11. These recessed silicon dioxide regions have already been formed utilizing the conventional silicon dioxide-silicon nitride composite masks which gives rise to the "bird's head" and "bird's beak" problems well known and described in the prior art as set forth in the previously mentioned J. A. Appels et al and E. Kooi et al publications. In the structure shown in FIGS. 1 and 1', the formation of the recessed silicon dioxide regions 11 have already been completed, the silicon dioxide-silicon nitride masks removed and the structure covered with a surface layer of silicon dioxide 12 which would have been most conveniently formed by thermal oxidation subsequent to the removal of the oxide-nitride masks. Each of the recessed silicon dioxide regions 11 has a "bird's head" or elevation 13 as well as a "bird's beak" 14 extending laterally from the head and in effect merging into silicon dioxide covering layer 12.

Figure 2:
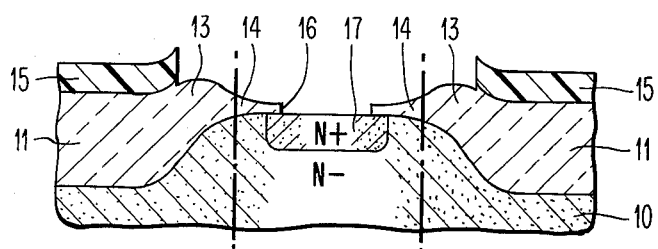
Figure 2:
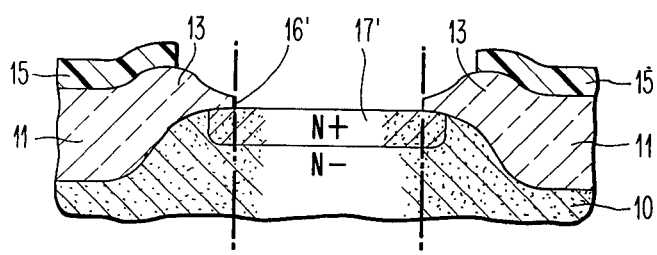

In the structure shown in FIG. 1 and FIG. 1', recessed oxide regions 11 had been formed utilizing silicon dioxide-silicon nitride masks with substantially identical lateral dimensions. However, because of the lack of definiteness of the lateral extent of the "bird's beak", it is clear that in the structure of FIG. 1 the adjacent "bird's beaks" 14 have encroached laterally into intermediate N- silicon pocket 10 to a greater extent than have the equivalent "bird's beaks" 14 in the structure of FIG. 1'. This may be readily seen with respect to the identical pairs of parallel phantom lines in FIGS. 1 and 1'. These phantom lines represent the extent of the openings to be formed in insulative layer 12 by conventional prior art dip etching techniques which will be described with reference to FIGS. 2 and 2'. The structure of FIG. 1 and 1' have been masked with a photoresist blockout mask 15 which is etch-resistant in preparation for the subsequent dip etch technique in order to form an opening in layers 12 for diffusion. Next, is shown FIGS. 2 and 2', when the structures of FIGS. 1 and 1' are subjected to a conventional dip etch technique for a period sufficient to remove the silicon dioxide layer having the thickness of layer 12, because of the variation in the position of the "bird's beak", and thus the variation in the extent of coverage of the silicon dioxide layer having the thickness of layer 12, opening 16 in FIG. 2 will have narrower dimensions than opening 16' in FIG. 2'. Then, when N-type impurities such as arsenic or phosphorus are introduced by conventional thermal diffusion techniques to respectively form N+ regions 17 and 17' in FIGS. 2 and 2' there will be a substantial variation in the lateral dimensions of these two regions.

At this point, it should be noted that even if regions 17 and 17' were formed by conventional ion implantation techniques (in a method not shown in the drawings) wherein the implantation of N-type impurities would be directly through silicon dioxide layer 12, the lateral dimensions of ion implanted regions equivalent to regions 17 and 17' would still have a substantial lateral variation because of the variation in the lateral dimension of surface regions wherein silicon dioxide layer 12 has a uniform thickness.

Figure 3:
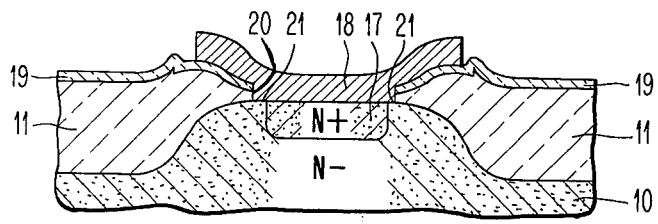
Figure 3:
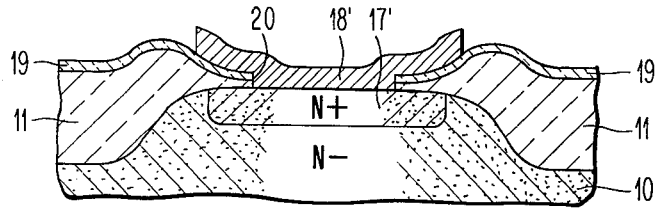

The prior art "bird's beak" problems become even further complicated when in subsequent integrated circuit fabrication operations, metallic contact such 18 and 18' are respectively made to regions 17 and 17' as illustrated in FIGS. 3 and 3' of the drawing. For purposes of this illustration of the prior art, we will assume that N+ regions 17 and 17' will serve as a contact region to N substrate 10 in order to ensure a better ohmic contact between metallic contact 18 and 18' and the substrate.

In the formation of contacts 18 and 18', a silicon dioxide layer is first reformed to cover openings 16 and 16' after which a silicon nitride layer 19 is deposited over the entire structure and contact openings 20 are formed through the silicon nitride and silicon dioxide layer to expose regions 17 and 17' after which contacts 18 and 18' are deposited utilizing standard techniques.

In comparing the contacts to the substrate in FIGS. 3 and 3', it will be noted that contact 18' is in contact with only N+ region 17' in the structure of FIG. 3' to provide the desired complete ohmic contact to the substrate. On the other hand, because of the problems discussed here and above with respect to the "bird's beak", contact 18 is in contact with N+ region 17 to provide an ohmic contact but is also in contact with surrounding N− regions 21 to provide Schottky Barrier contacts substantially in parallel with the ohmic contact. It should be recognized that conventional metallurgies for contacts 18 and 18' such as aluminum or platinum will form only contacts with N+ regions, i.e., having $C_0$ greater than $10^{20}$ atoms/cm$^3$ while forming Schottky Barrier contacts with N− regions having $C_0$ less than $10^{18}$ atoms/cm$^3$. Having a Schottky Barrier diode in parallel with an ohmic contact as in the structure of FIG. 3 is highly disadvantageous in that it imposes the non-linear diode effect on the ohmic contact resistance which has to be linear with respect to voltage and current in order to function properly.

While the foregoing was given merely by way of illustration of the problems that the "bird's beak" presents with respect to the lateral dimension of the regions introduced into the substrate as well as the formation contact openings, similar problems would be encountered in the formation of P-type resistors in an N substrate and contacts thereto or in the formation of N+ resistor regions in an N− substrate. Likewise, the prior art techniques would also face the "bird's beak" problems when in attempting to open a contact to an N+ emitter which has been introduced into a P-type base region defined by a recessed silicon dioxide in the case where at least a portion of the emitter is laterally also defined by the recessed oxide. This would be particularly true when the technique would attempt to use recessed oxide to define a portion of the emitter contact. In such a case, the indefinite position of the "bird's beak" would give rise to the distinct possibility of exposing the PN base junction when opening the emitter contact.

PREFERRED EMBODIMENTS OF PRESENT INVENTION

Figure 4A:
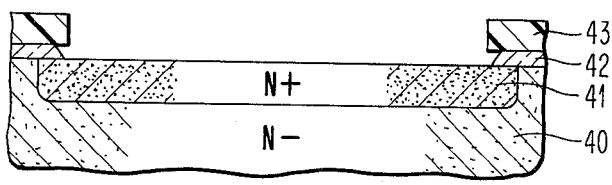
FIGS. 4A – 4E' are diagrammatic sectional views of an integrated circuit in order to illustrate the method of the preferred embodiment of the present invention.

With reference to FIG. 4A, in a suitable substrate 40 of N-type silicon, conveniently an epitaxial layer having a $C_0$ less than $10^{18}$ atoms/cm$^3$, N+ region 41 is formed utilizing conventional photolithographic masking techniques involving a standard silicon oxide masking of the surface of the substrate. For example, as shown, a silicon dioxide layer 42 may be conveniently formed by thermal oxidation. Then utilizing a photoresist mask 43, an opening is etched in silicon dioxide layer 42, and N+ region 41 is formed through this opening by conventional thermal diffusion of impurities such as phosphorus, arsenic, antimony or the like to a surface concentration of $10^{21}$ atoms/cm$^3$. Alternatively, N+ region 41 may be formed utilizing conventional ion implantation techniques for the introducton of the N-type impurities.

It should be noted that the structure being shown and described is only a small portion of an integrated circuit and is intended to illustrate how the method of the present invention is operable to fabricate recessed silicon dioxide structures wherein the effect of the "bird's beak" with respect to the definition of regions of selected conductivity-types introduced into the substrate or electrical contact openings to such regions is minimized. It should further be noted, that for purposes of illustration herein the lateral extent of the "bird's beak" in the diagram has been somewhat diagrammatically exaggerated in order to clearly show the effects of the "bird's beak" upon lateral dimensions and opening sizes.

With respect to the particular steps involved in the formation of recessed silicon dioxide, U.S. Pat. No. 3,858,231 may be referred to if any greater detail is required with respect to any particular step.

Figure 4B:
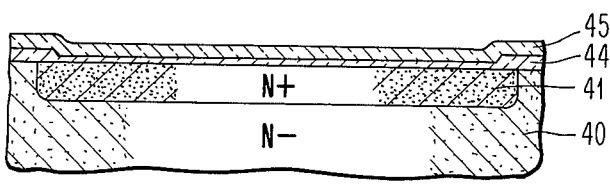

Next, FIG. 4B, the surface of silicon substrate 40 is then subjected to a thermal oxidation to regrow a layer of silicon dioxide over N+ region 41 to a thickness of 1000 A. The resulting silicon dioxide layer is now designated as layer 44. This is, of course, done after the removal of the photoresist layer 43. Next, the layer comprising silicon nitride 45 having a thickness of 1000 A is deposited over the entire structure. Silicon nitride layer 45 can be formed by any conventional techniques such as the chemical vapor deposition, the action of silane and ammonia. This reaction is only carried out at a temperature in the order of 1,000° C. Alternatively, silicon nitride layer 45 may be deposited by conventional RF sputter deposition techniques. While layer 16 is preferably formed of silicon nitride alone, it may also have a composition which is predominantly silicon nitride together with small amounts of silicon oxide or dioxide.

Figure 4C:
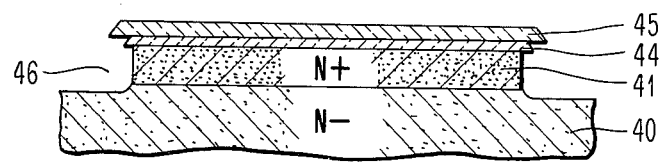

Next, FIG. 4C, utilizing standard photolithographic etching techniques, openings are first etched through silicon nitride layer 45. One conventional technique for etching openings through the silicon nitride layer involves forming by standard photoresist methods, a deposited silicon dioxide mask (not shown) over the silicon nitride layer 45, defining openings in that layer, and etching with a suitable etchant for silicon nitride such as hot phosphoric acid or hot phosphoric salt. The silicon dioxide mask (not shown) to the silicon nitride layer is then removed and the remaining silicon nitride serves as a mask for the subsequent formation of openings through silicon dioxide layer 44 coincident with the openings through silicon nitride layer 45. A suitable etchant for the silicon dioxide is buffered hydrofluoric acid.

Figure 4D:
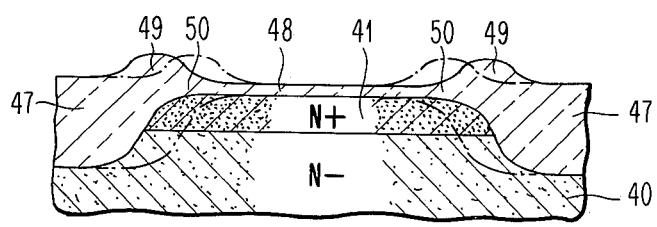

Next, a composite of the silicon dioxide mask 44 and silicon nitride mask 45 is utilized as a mask and N+ region 41 are etched to provide recesses 46, utilizing a conventional etchant for silicon such as a composition of nitric acid and diluted hydrofluoric acid. Recesses 46 are about 0.35 microns in depth resulting in the mesa-like structure shown in FIG. 4C. The structure is then put through an oxidation cycle wherein it is placed in an oxidation atmosphere at an elevated temperature, in the order of 970° C – 1100° C with the addition of water to produce silicon dioxide recessed regions 47 as shown in FIG. 4D. The oxidation is continued until regions 47 are substantially coplanar with the surface of N+ region 41. During the formation of the recessed oxide, a portion of silicon substrate 40 is consumed so that recessed silicon dioxide region 47 extends down approximately 1.0 microns from the surface. Then, mask 45 is removed from the surface of region 41. The resulting structure shown in FIG. 4D will have a "birds's head" 49 as well as a "bird's beak" 50. However, irrespective of any possible lateral variation in the position of the "bird's head" and "bird's beak" as illustrated in FIG. 4D by the phantom lines, the lateral sides of N+ region 41 will abut recessed silicon dioxide regions 47.

Figure 4E:
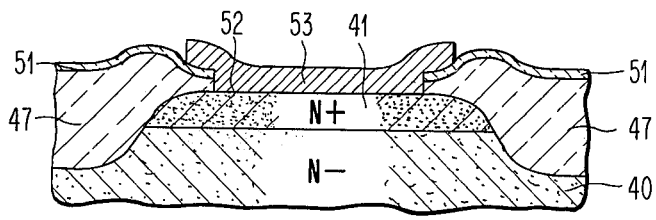
Figure 4E:
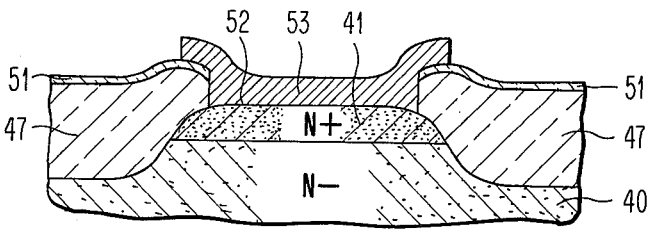

Next, as illustrated in FIGS. 4E and 4E', a silicon nitride mask 51 is formed over the structure by depositing a layer of silicon nitride about 1500 A in thickness over the layer as previously described, an opening is formed through the silicon nitride layer 51 as shown in the manner previously described, and with silicon nitride layer 51 serving as a mask, the underlying silicon dioxide layer 48 is etched through to form openings 52. The structure shown in FIG. 4E is that having a lateral "bird's head" and "bird's beak" position equivalent to that of FIG. 4D while the structure of 4E' has a lateral "bird's head" and "bird's beak" position equivalent to that shown in the phantom lines in FIG. 4D.

Therefore, in the sturctures shown, when metallic contacts such as aluminum or platinum contacts 53 are deposited, a complete ohmic contact is made with region 41 irrespective of the lateral position of the "bird's beak", i.e., whether it be in the further apart position of FIG. 4E or in the closer position of FIG. 4E'. Consequently, when utilizing the method of the present invention, the problems of parallel Schottky Barrier diode paths to ohmic contacts shown in the structure of FIG. 3, representative of the prior art, are eliminated. Likewise, the possibility of exposing a PN junction in the contact opening because of the lateral indefiniteness of the "bird's beak" is also eliminated.

Figure 5:
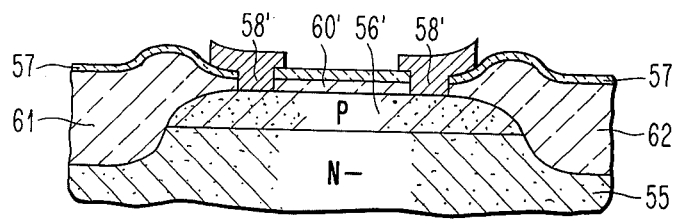
FIG. 5 is a diagrammatic sectional view of a portion of an integrated circuit which is an equivalent view to FIG. 4E in order to illustrate the variation in the embodiment of the present invention.

While the method of the present invention has been described with respect to the formation of single contact traversing the regions such as region 41 defined by abutting recessed silicon dioxide regions 47, it will be understood that the advantages of the present invention are equally applicable to structures wherein the contact does not traverse the surface of the whole region but rather is made to only one side of the region abutting a recessed silicon dioxide region. For example, with reference to FIG. 5, the structure shown comprising N— substrate 55 in which region 56 formed by the introduction of P-type impurities may be produced by the methods of FIGS. 4A – 4E. Silicon nitride masking layer 57 is used to define a pair of openings 58 and 59 through silicon dioxide surface layer 60. Recessed silicon dioxide region 61 serves to define one edge of contact opening 58 and recessed silicon dioxide region 62 serves to define one edge of contact opening 58'. Since region 56 was formed prior to the formation of recessed silicon dioxide regions 61 and 62, the PN junction can never be exposed in either contact opening 58 or 58' irrespective of the lateral positions of the "bird's beaks" associated with either recessed silicon dioxide region 61 or region 62.

Where a plurality of regions of selected conductivity-type such as region 41 in FIG. 4A are to be introduced into the substrate, the method of FIGS. 4A - 4E may be utilized with an introduction of a plurality of discrete regions such as region 41 at selected locations in the substrate. Alternatively, as shown in FIGS. 6A – 6E, and initially with respect to FIG. 6A, in a substrate 65 of the same composition of substrate 40, there may be introduced by a a blanket diffusion over all or a substantial portion of the substrate an N+ region 66 being equivalent in composition to N+ region 41. Then, a mask comprising a composite of a silicon dioxide layer 67 and a silicon nitride layer 68 is formed utilizing the methods described in FIGS. 4B and 4C to result in the structure shown in FIG. 6B having a plurality of mask openins 68.

Figure 6A:
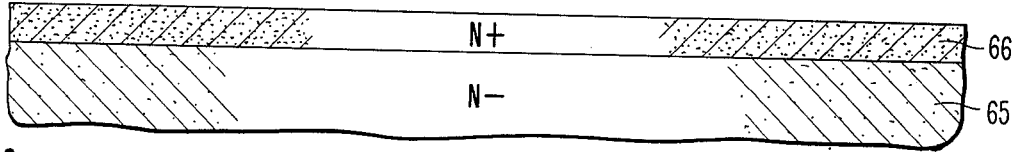
FIGS. 6A – 6E are diagrammatic sectional views of a portion of an integrated circuit in order to illustrate an embodiment of another aspect of the present invention.
Figure 6B:
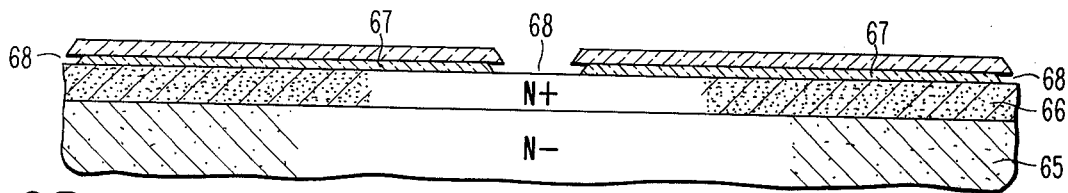
Figure 6C:
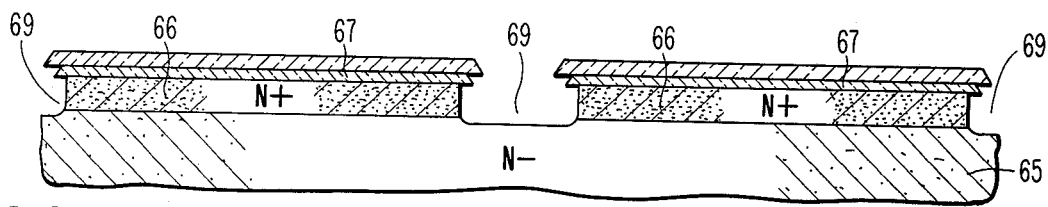
Figure 6D:
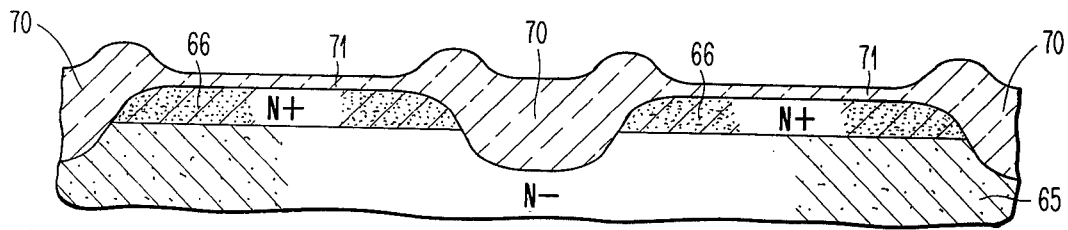

Next, utilizing the etching method described with respect to FIG. 4C, recesses 69 are etched through blanket N+ region 66 into N— substrate 65 to produce the structure shown in FIG. 6C which is equivalent to the structure of FIG. 4C except that there are a plurality of defined N+ regions 66.

Next, utilizing the thermal oxidation process previously described with respect to FIG. 4D, the substrate is subjected to a thermal oxidation to produce a plurality of recessed silicon dioxide regions 70 defining a plurality of N+ regions 66. Then, as previously described, a silicon dioxide layer 71 is formed over the surface of the structure.

Figure 6E:
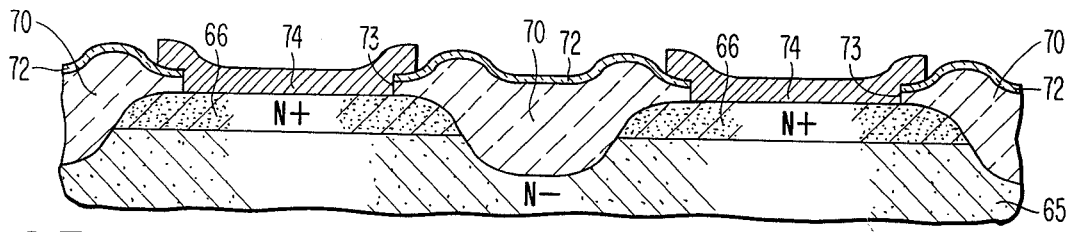

Finally, utilizing the method described above with respect to FIG. 4E, a silicon nitride mask 72 is formed over the substrate, a plurality of contact opening 73 are formed and contacts of an appropriate metal 74 are made to the substrate to produce the structure of FIG. 6E. The structure of FIG. 6E has a plurality of regions each displaying the advantages of the structure of FIG. 4E.

In the practice of the method described with respect to FIGS. 6A – 6E, it is important that recesses 69 formed in the substrate, FIG. 6E, extend beyond the depth of N+ regions 66. Otherwise, there is a distinct possibility that during the thermal oxidation to form regions 70, any introduced impurities forming the N+ regions still below recesses 69 will be driven into the substrate below the recessed region 70 in a "snowplow-like" effect to provide an N+ path around recessed region 70 connecting adjoining N+ regions 66.

While the invention has been particularly shown and described with reference to the preferred embodiment thereof, it will be understood by those skilled in the art that various changes in form and details may be made therein without departing from the spirit and scope of the invention.

What is claimed is:

1. In the fabrication of integrated circuits, a method for forming dielectrically isolated regions in a silicon substrate comprising introducing conductivity-determining impurities into the substrate to form at least one region of one-type conductivity at the surface of said substrate forming over at least a part of said surface of said region, a composite mask comprising a lower layer of silicon dioxide in contact with said surface, and an upper layer of silicon nitride on said lower layer, said mask having a plurality of apertures extending therethrough, etching recesses in the portions of said substrate exposed in said apertures, thermally oxidizing the recessed portions of said substrate to an extent sufficient to form regions of recessed silicon dioxide abutting and laterally defining said at least one region of one-type conductivity, said mask acting as a barrier to prevent oxidation of the unrecessed surface of said substrate, providing a layer of electrically insulative material over at least a portion of the surface of said substrate by a processing step comprising at least the removal of said silicon nitride layer, forming at least one contact opening through said electrically insulative layer to expose at least a portion of said at least one region of one-type conductivity, said contact opening exposing a portion of a region of recessed silicon dioxide abutting said one-type conductivity region and depositing metal in said contact opening to form a contact to said region of one-type conductivity, said contact over-lapping said recessed silicon dioxide.

2. The method of claim 1 wherein said conductivity-determining impurities are introduced by diffusion.

3. The method of claim 1 wherein said conductivity-determining impurities are introduced by ion implantation.

4. The method of claim 1 wherein said conductivity-determining impurities are introduced so that said region of one-type conductivity blankets the surface of said substrate, and said regions of recessed silicon dioxide are formed so as to laterally separate said blanket region of one-type conductivity into a plurality of regions of said one-type conductivity, each laterally defined by said recessed silicon dioxide regions.

5. The method of claim 4 wherein said recesses are etched into said substrate to a depth beyond that of said blanket region of one-type conductivity.

6. The method of claim 1 wherein said contact opening is formed so as to completely traverse defined region of one-type conductivity and to overlap said recessed oxide regions on both sides of said traversed region.

* * * * *